United States Patent [19]
Chan

[11] Patent Number: 5,945,012
[45] Date of Patent: Aug. 31, 1999

[54] TUMBLING BARREL PLASMA PROCESSOR

[75] Inventor: Chung Chan, Newton, Mass.

[73] Assignee: Silicon Genesis Corporation, Campbell, Calif.

[21] Appl. No.: 09/024,283

[22] Filed: Feb. 17, 1998

Related U.S. Application Data

[60] Provisional application No. 60/038,090, Feb. 18, 1997.

[51] Int. Cl.$^6$ ..................................................... B23K 10/00
[52] U.S. Cl. .................................. 219/121.43; 219/121.4; 219/121.48; 219/121.52; 156/345; 118/723 I
[58] Field of Search ........................... 219/121.4, 121.43, 219/121.48, 121.52; 156/345, 643.1, 646.1; 118/723 I, 723 R; 373/18–22

[56] References Cited

U.S. PATENT DOCUMENTS

| | | | |
|---|---|---|---|
| 3,926,147 | 12/1975 | Steube | 118/49.1 |
| 4,304,983 | 12/1981 | Pierfederici | 219/121.43 |
| 4,803,332 | 2/1989 | Koyama et al. | 219/121.52 |
| 5,362,353 | 11/1994 | Mallon | 156/345 |

*Primary Examiner*—Mark Paschall
*Attorney, Agent, or Firm*—Townsend and Townsend and Crew LLP

[57] ABSTRACT

A tumbling barrel plasma processing method and apparatus are presented. The tumbling barrel plasma processor includes a vacuum chamber, a plasma source, a power supply, a rotatable barrel which is disposed within the vacuum chamber and a barrel rotation mechanism for rotating the barrel. The plasma source generates a plasma surrounding the rotatable barrel. The barrel is made up of at least one conductive screen of a certain transparency that allows ions to pass therethrough. The power supply provides a negative voltage which is applied to the screens of the barrel to extract ions from a plasma surrounding the rotatable barrel. Alternately a positive voltage can be applied to the screens of the barrel to extract electrons from the plasma surrounding the rotatable barrel. The barrel is rotated by the barrel rotation mechanism such that the samples disposed within the barrel are tumbled, thereby the samples receive plasma treatment on all sides. Insulative samples can also be processed since the voltage is applied between the plasma and the screens and, since no voltage is applied directly to the samples themselves, there is no need to capacitively couple the voltage to the insulative samples. An advantage of the present method and apparatus is that the ions or electrons are coming from all directions due to the cylindrical symmetry of the electric field provided between the screens and the plasma. The ion current density is approximately the same for an ion beam of a plasma source ion implantation and the present invention, however the total ion current is higher for the present invention due to the large area of the rotatable barrel. Accordingly, throughput for the tumbling barrel plasma processor is much higher.

16 Claims, 2 Drawing Sheets

TUMBLING BARREL PLASMA PROCESSOR

CROSS REFERENCE TO RELATED APPLICATIONS

This application claims priority under 35 U.S.C. §119(e) to provisional patent application Ser. No. 60/038,090 filed Feb. 18, 1997; the disclosure of which is incorporated herein by reference.

STATEMENT REGARDING FEDERALLY SPONSORED RESEARCH OR DEVELOPMENT

Not applicable

BACKGROUND OF THE INVENTION

The plasma processing of work-pieces having a variety of shapes and sizes in a conventional plasma processor has proven to be inconvenient because the pieces are difficult to hold. As a result, conventional plasma processors work well for semiconductor wafers which are typically flat and can be easily held by a flat wafer holder. Other plasma processors work well for samples that are large in size but these processors are not economical for samples that are small in size and require uniform plasma treatment. One type of conventional plasma processor is known as a Plasma Source Ion Implantation (PSII) processor. In the PSII processor a negative voltage is applied directly to the sample being processed. The application of the negative voltage to the sample results in the sample extracting ions from a plasma generated adjacent the samples. The PSII processor does not easily handle multiple samples for treatment at the same time, since each sample must be individually connected to the negative voltage. Further, if the sample is non-conductive, the PSII processor becomes somewhat less effective since the voltage must be capacitively coupled from the sample holder, through the sample and the plasma sheath. A conventional beam line ion implantor is not effective for multiple samples of various shapes since the ion beam utilized by such samples has a relatively small cross-sectional area and thus requires scanning over the entire sample. As such, the sample needs to be maneuvered in a complicated fashion in order to receive a uniform treatment. It would be desirable to have a plasma processor which provides uniform treatment to a plurality of various shaped samples in an easy, convenient and efficient manner.

BRIEF SUMMARY OF THE INVENTION

A tumbling barrel plasma processing method and apparatus are presented. The tumbling barrel plasma processor includes a vacuum chamber, a plasma source, a power supply, a rotatable barrel which is disposed within the vacuum chamber and a barrel rotation mechanism for rotating the barrel. The plasma source generates a plasma surrounding the rotatable barrel. The barrel is made up of at least one conductive screen of a certain transparency for allowing ions to pass therethrough. The power supply provides a negative voltage which is applied to the screens of the barrel to extract ions from a plasma surrounding the rotatable barrel. Alternately a positive voltage can be applied to the screens of the barrel to extract electrons from the plasma surrounding the rotatable barrel. The barrel is rotated by the barrel rotation mechanism such that the samples disposed within the barrel are tumbled, thereby the samples receive plasma treatment on all sides. Insulative samples can also be processed since the voltage is applied between the plasma and the screen and, since no voltage is applied directly to the samples themselves, there is no need to capacitively couple the voltage to the insulative samples.

An advantage of the present method and apparatus is that the ions or electrons are coming from all directions due to the cylindrical symmetry of the electric field provided between the screens and the plasma. The ion current density of the present invention is approximately the same as the ion beam of a conventional plasma source ion implantation device, however the total ion current is higher for the present invention due to the large area of the rotatable barrel. Accordingly, throughput for the tumbling barrel plasma processor is much higher.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
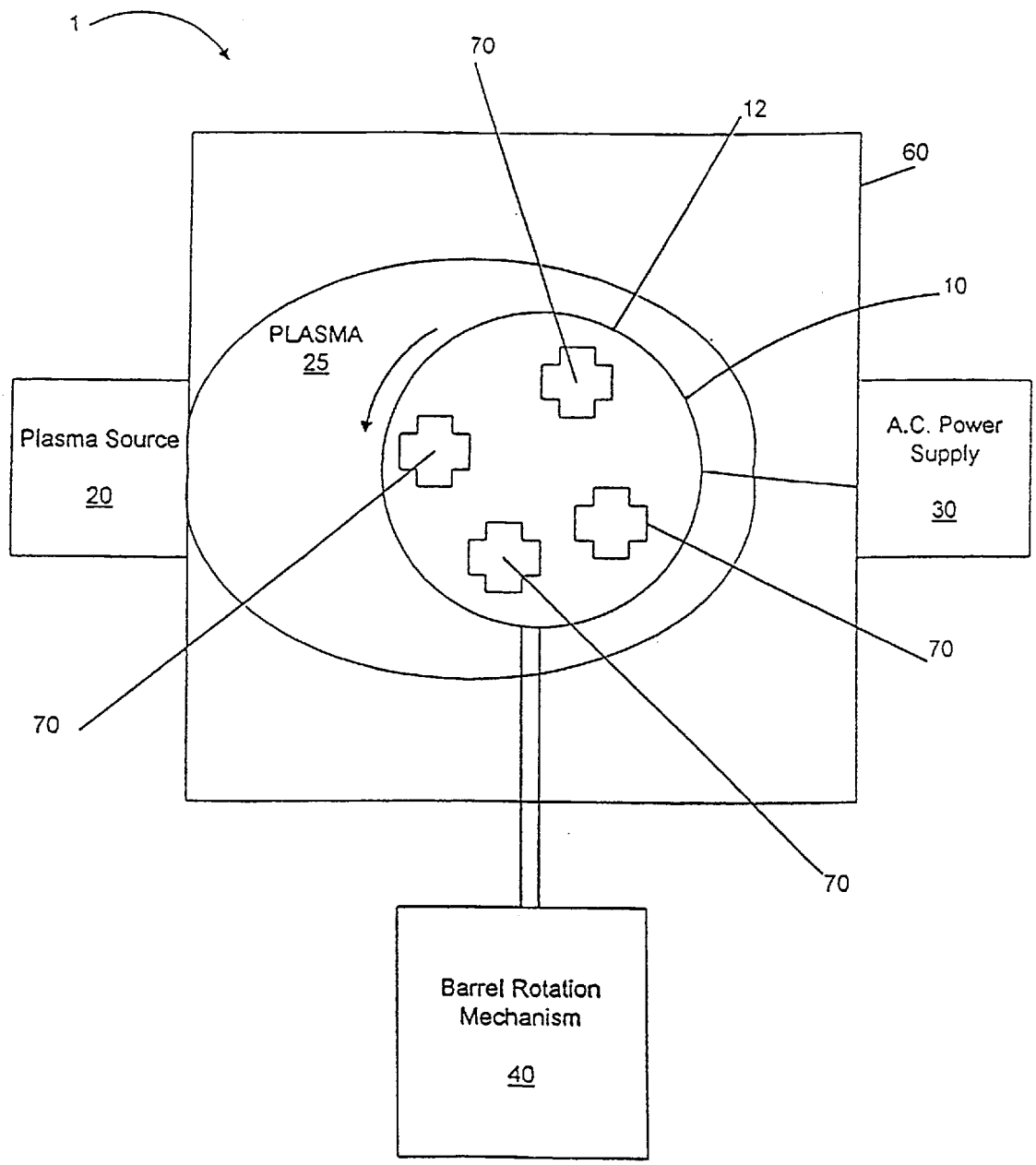
FIG. 1 is a diagram of the tumbling barrel plasma processor of the present invention.

Referring to FIG. 1, a tumbling barrel plasma processor 1 is shown. The tumbling barrel plasma processor 1 comprises a vacuum chamber 60, a plasma source 20, a rotatable barrel 10, a power supply 30 and a barrel rotation mechanism 40. The barrel 10 is comprised of a screen 12 of conductive wires of a certain transparency that allows ion to pass therethrough.

Plasma source 20 provides a plasma 25 surrounding the rotatable barrel 10. The plasma 25 is at a slightly higher positive potential than ground. The plasma source 20 may be any known type of plasma source such as an Inductively Coupled Plasma Source (ICP), a Transformer Coupled Plasma Source (TCP), an Electron Cyclotron Resonance Source (ECR) a Helicon Source (HS), a Hot Cathode Plasma Source (HCPS) or a Cold Cathode Source (CCS).

The A.C. power supply 30 provides a negative voltage to the screen 12 to extract ions from the plasma 25. The vacuum chamber 60 is grounded, while the plasma 25 is normally at a slightly positive potential, typically ten volts.

Multiple samples 70, up to tens of thousands of them, are disposed within the barrel 10. A plasma 25 is generated that surrounds the barrel 10 and the samples 70 which are disposed within the barrel. A negative voltage is supplied to the screen 12 from the power supply 30 in order to extract ions from the plasma 25 surrounding the barrel 10. The barrel 10 is rotated by engaging the barrel rotation mechanism 40. The barrel rotation mechanism 40 may be a rack and pinion style arrangement, a belt and pulley arrangement or any other rotation mechanism as is known in the art. The rotation of the barrel 10 causes the samples 70 to tumble inside the barrel 10. As a result, the samples 70 end up receiving plasma treatment on all sides.

Samples which themselves are nonconductive can also be treated in the same manner. Since in the presently disclosed device the voltage is applied between the plasma 25 and the screen 12, and not to the samples themselves, there is no requirement that the samples be conductive in order to extract the ions from the plasma, nor is there any need to capacitively couple the voltage to the samples.

Due to the cylindrical shape of the barrel 12 and since the plasma 25 surrounds the barrel 12, the electric field that is developed is also cylindrical and thus provides ions at 360 degrees with respect to the samples 70 being processed. The ion current density for the present invention is roughly the same for a conventional ion beam plasma processor, but the total ion dosage is much higher in the present invention due to the large area of the barrel which theoretically translates into a throughput of one hundred to one thousand times faster than the conventional ion beam process.

A positive voltage can be supplied to the screen 12 by the A.C. power supply 30 in order to extract electrons (as opposed to ions) from the plasma 25 surrounding the rotatable barrel 10.

Figure 2:
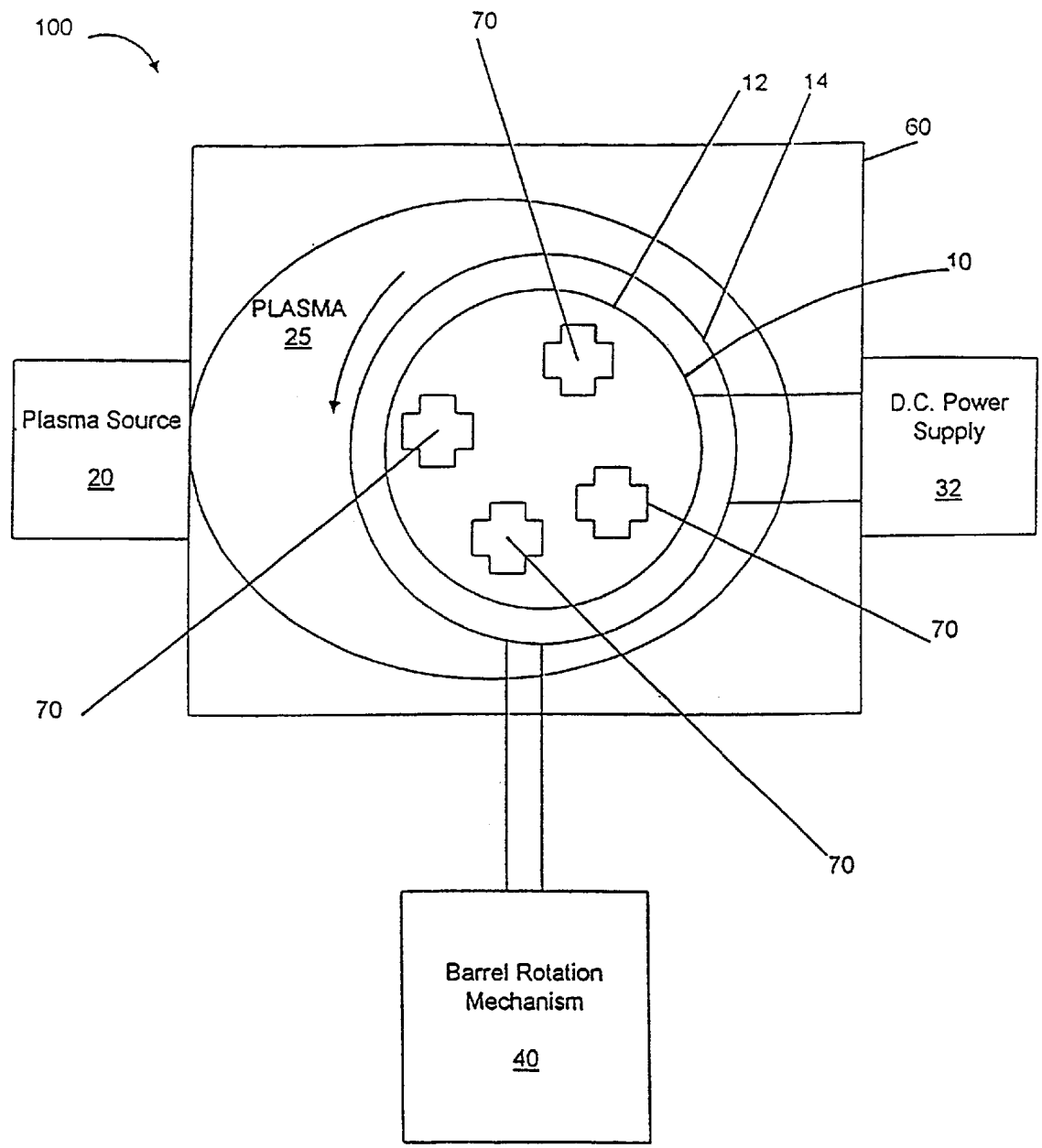
FIG. 2 is a diagram of a further embodiment of a tumbling barrel plasma processor.

Referring now to FIG. 2, an additional embodiment of a tumbling barrel plasma processor 100 is shown. The tumbling barrel plasma processor 100 in this embodiment comprises a vacuum chamber 60 with a plasma source 20, a rotatable barrel 10, a D.C. power supply 32 and a barrel rotation mechanism 40. The barrel 10 is comprised of at least two screens 12 and 14, each screen comprised of conductive wires of a certain transparency that allows ion to pass therethrough. Plasma source 20 provides a plasma 25 surrounding the rotatable barrel 10. The vacuum chamber 60 is grounded, while the plasma 25 is normally at a slightly higher positive potential than ground. A negative voltage from the D.C. power supply 32 is provided to the screens 12 and 14 to extract ions from the plasma 25.

While the voltage applied may be pulsed, the use of a D.C. voltage allows for more than one screen to be used so that the ions are accelerated. The plasma acceleration also enables the co-impartation of multiple ion species through the mixture of different gasses.

Multiple samples 70, up to tens of thousands of them, can be placed in the barrel 10. A plasma 25 is generated that surrounds the barrel 10 and the samples 70 disposed within the barrel 10. A negative voltage is supplied to the screens 12 and 14 in order to extract ions from the plasma 25 surrounding the barrel 10. The barrel 10 is rotated by engaging barrel rotation mechanism 40. The rotation of the barrel 10 causes the samples 70 to tumble inside the barrel 10. As a result, the samples 70 end up receiving plasma treatment from all sides. Samples which themselves are nonconductive can also be treated in the same manner, since the voltage is applied between the plasma 25 and the screens 12 and 14, and not to the samples themselves. The ions are coming from all directions due to the cylindrical symmetry of the electric field between the screens 12 and 14 and the plasma 25. The ion current density is roughly the same for the ion beam and the present invention, but the total ion dosage is much higher in the present invention due to the large area of the barrel which theoretically translates into a throughput of one hundred to one thousand times faster than the conventional ion beam process.

A positive voltage can be supplied to the screens 12 and 14 by the D.C. power supply 32 in order to extract electrons from the plasma 25 surrounding the rotatable barrel.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

I claim:

1. A plasma processor comprising:
   a rotatable barrel comprising a screen of conductive elements disposed within said rotatable barrel, said rotatable barrel receiving at least one sample to be processed within said screen;
   a plasma source operative and coupled to said rotatable barrel to generate a plasma surrounding said rotatable barrel;
   a voltage source in electrical communication with said screen of conductive elements and operative to provide a voltage to said screen of conductive elements to implant ions from said plasma into said one sample; and
   a barrel rotation mechanism coupled to said rotatable barrel and operative to rotate said rotatable barrel.

2. The plasma processor of claim 1 further comprising a vacuum chamber surrounding said rotatable barrel, and wherein the plasma is generated within said vacuum chamber.

3. The plasma processor of claim 1 wherein said voltage source provides a D.C. voltage.

4. The plasma processor of claim 1 wherein said voltage source provides an A.C. voltage.

5. The plasma processor of claim 1 wherein said voltage source provides a positive voltage.

6. The plasma processor of claim 1 wherein said voltage source provides a negative voltage.

7. The plasma processor claim 1 wherein said voltage source is pulsed.

8. The plasma processor of claim 1 wherein said plasma is at a voltage of approximately ten volts.

9. A method of plasma processing comprising the steps of:
   disposing at least one sample within a rotatable barrel comprising a screen of conductive elements disposed within said rotatable barrel, said one sample being disposed within said rotatable barrel;
   generating a plasma surrounding said rotatable barrel using a plasma source;
   providing a voltage on said first screen of conductive elements to implant ions from said plasma into said one sample; and
   rotating said rotatable barrel such that said at least one sample receives ions from said plasma on its entire surface.

10. The method of claim 9 further comprising the step of generating a vacuum about said barrel and said plasma.

11. The method of claim 9 wherein said step of providing a voltage comprises providing a D.C. voltage.

12. The method of claim 9 wherein said step of providing a voltage comprises providing an A.C. voltage.

13. The method of claim 9 wherein said step of providing a voltage comprises providing a positive voltage.

14. The method of claim 9 wherein said step of providing a voltage comprises providing a negative voltage.

15. The method of claim 9 wherein said step of providing a voltage comprises providing a pulsed voltage.

16. The method of claim 9 wherein said step of generating a plasma comprises generating a plasma having a voltage of approximately ten volts.

* * * * *